INVENTORS
PAUL P. CASTRUCCI
JOHN W. MASON
BY George O. Saile
ATTORNEY

April 20, 1971 P. P. CASTRUCCI ET AL 3,575,740

METHOD OF FABRICATING PLANAR DIELECTRIC ISOLATED INTEGRATED CIRCUITS

Filed June 8, 1967

2 Sheets-Sheet 2

United States Patent Office 3,575,740
Patented Apr. 20, 1971

3,575,740
METHOD OF FABRICATING PLANAR DIELECTRIC ISOLATED INTEGRATED CIRCUITS

Paul P. Castrucci and John W. Mason, Poughkeepsie, N.Y., assignors to International Business Machines Corporation, Armonk, N.Y.

Filed June 8, 1967, Ser. No. 644,601
Int. Cl. H01l 7/36, 3/00
U.S. Cl. 148—175 15 Claims

ABSTRACT OF THE DISCLOSURE

A method for fabricating dielectric isolated integrated devices which allows the formation of a truly planar surface. The method includes etching isolation channels in a semiconductor substrate through a suitable mask. The mask pattern is designed to enhance deeper etching at certain locations in the isolation channels. A dielectric layer is formed over the exposed surfaces of the isolation channels and a semiconductor material is grown in the channels. The deeper etched locations which are now filled with dielectric isolation are used as a depth guide in the formation of a dielectric layer from the semiconductor substrate surface opposite to the one from which the etching took place. The depth guide can be used in either a deep etch or lap-back process. The last isolation step is then to continue the dielectric layer past the depth guide to the major portion of the isolation channels to produce the fully isolated islands of semiconductor material in the semiconductor substrate.

BACKGROUND OF INVENTION

(1) Field of invention

The present invention is directed to integrated circuits and more particularly to methods of forming monolithic integrated circuit devices with dielectric isolation. The monolithic integrated circuit method involves the diffusing or depositing of active and passive circuit elements in or on a homogeneous semiconductor substrate. A most apparent advantage in this form of semiconductor device is the dramatic size reduction possible over discrete devices.

Monolithic integrated circuits require isolation between devices which is an added problem over the discrete devices which are by definition isolated from one another. It is, of course, required that only the desired electrical connections be present between active and passive circuit elements. There are several methods for isolating circuit elements in monolithic circuits including junction isolation and dielectric isolaton.

(2) Description of prior art

Dielectric isolation does not use P-N junctions to provide isolation, but instead uses a dielectric such as silicon dioxide to form the insulation barrer between suitably built semiconductor areas. The typical method is to start out with, for example, an N-type silicon wafer of the desired transistor collector resistivity. The wafer is masked and the insolation pattern is etched into the silicon wafer. The wafer is then thermally oxidized to produce a silicon dioxide coating over the etched area. The silicon wafer is then placed in an epitaxial deposition chamber and a layer of polycrystalline silicon is deposited over the oxidized wafer until the etched openings are completely filled and a coating of the polycrystalline silicon covers the wafer surface. The wafer is then lapped on the monocrystalline silicon side until the etched channels are reached and the polycrystalline areas uncovered. At this point, there are dielectrically isolated islands of N-type silicon material which can be used to form semiconductor devices therein.

One of the major difficulties with the fabrication of monolithic integrated circuits which use dielectric isolation is the non-planar surfaces which are produced during the lapping or etching step. The surface irregularities are present over the isolation areas and appear as either depressions or bumps. These depressions or bumps make the photolithographic process which is necessary to the formation of semiconductor devices in the isolated islands very difficult.

SUMMARY OF THE INVENTION

It is thus an object of the present invention to provide an improved method for fabricating a dielectric isolated semiconductor device structure which is substantially planar.

It is another object of this invention to provide depth guides in the isolation channels which may be utilized to provide a substantially planar dielectrically isolated substrate having islands of monocrystalline silicon therein.

In accordance with one form of the process for fabricating planar isolated semiconductor devices, the process is initiated by forming dielectric layers on opposite sides of the semiconductor substrate. Openings are then formed in a line pattern having at least one corner in the dielectric layer adherent to one of the surfaces of the semiconductor substrate. Isolation channels in the form of the established line pattern are produced in the semiconductor substrate by a standard etching procedure. The etching is continued until the dielectric layer on the opposite side of the semiconductor substrate is reached at the areas which are etched somewhat deeper at the corner areas in the line pattern. These deeper areas of the isolation channels act as a depth guide. A dielectric layer is then formed over the exposed surfaces of the isolation channels. Material is then grown over this dielectric layer in the isolation channels to fill the isolation channels. The dielectric layer on the opposite side from which etching was effected is then extended into the semiconductor substrate until fully isolated islands of semiconductor material are formed in the substrate. The extension of the dielectric layer can be accomplished where silicon is the semiconductor substrate by a thermal oxidation process.

Another form of the present invention which uses the depth guides to form a planar dielectric isolated semiconductor structure is initiated by forming openings in a line pattern having at least one corner in a dielectric layer adherent to one surface of the semiconductor substrate. The semiconductor substrate is then etched in the established line pattern to produce the isolation channel in the substrate. The channels are etched somewhat deeper at each corner in the line pattern. In this embodiment the etching does not continue all the way through the semiconductor substrate. A dielectric layer is formed over the exposed surfaces of the isolation channels. A material is then grown over the previously formed dielectric layer in the isolation channels. Material is then removed from the semiconductor substrate by a convenient process, such as lapping or etching, until the deeper channel portions at the corners of the isolation channels are reached. A dielectric layer is then formed on the side which material was removed into the semiconductor substrate until fully isolated islands of semiconductor material are formed in the substrate. Here again, if the semiconductor substrate is silicon, the final dielectric layer can be accomplished by thermally oxidizing the silicon to fully isolate the islands of semiconductor material.

The foregoing and other objects, features and advantages of the invention will be apparent from the following more particular description of the preferred embodiments of the invention, as illustrated in the accompanying drawings.

DESCRIPTION OF PREFERRED EMBODIMENTS

Figure 1:
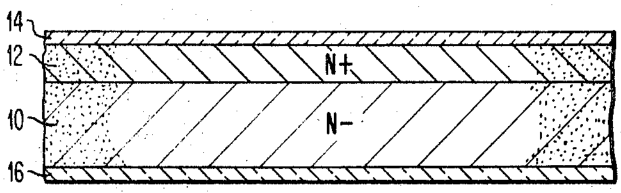
FIGS. 1–8 illustrate one embodiment of the process for fabricating planar dielectrically isolated semiconductor devices.

Referring now to FIGS. 1–8, there is schematically shown greatly enlarged sections of the steps in the process for fabricating a planar dielectrically isolated semiconductor device. In FIG. 1, a wafer 10 of monocrystalline semiconductor material of either N or P-type was prepared by conventional semiconductor techniques. There has been grown by a standard epitaxial gowth process a semiconductor layer 12 on the wafer 10. For illustration purposes the substrate 10 is N-type monocrystalline silicon and the epitaxial layer N+ silicon. It may be preferable to use a thin silicon wafer of the order of less than about 4 mils in thickness to give better control of the subsequent channel etching step and prevent significant undercutting of the mask. The semiconductor wafer 10, 12 was then thermally oxidized to produce the silicon dioxide layers 14 and 16 on the surfaces of the semiconductor wafer. Of course, other dielectric layers could be applied to the surfaces, such as silicon nitride and the silicon dioxide layers by other processes such as pyrolitic deposition and sputtering. These other techniques are particularly useful where the semiconductor wafer utilized is not silicon but is another semiconductor material, such as germanium, III–IV compounds, etc.

Figure 2:
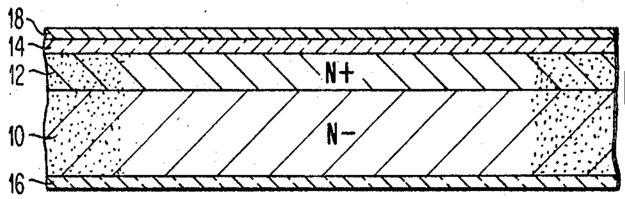
Figure 3:
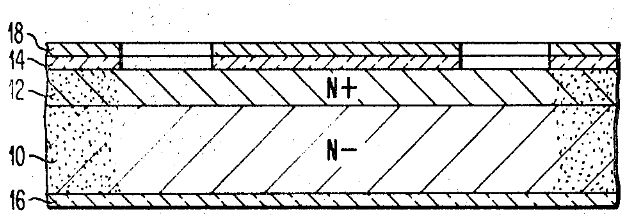
Figure 5:
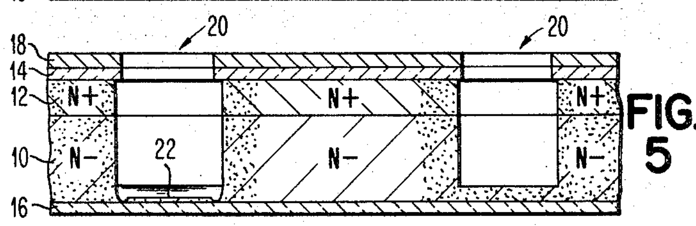
Figure 6:
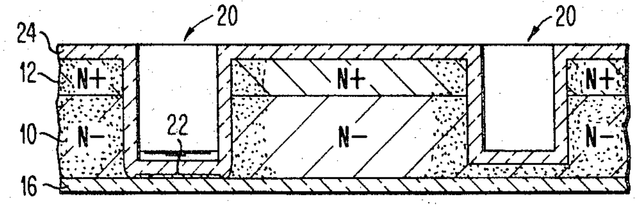
Figure 4:
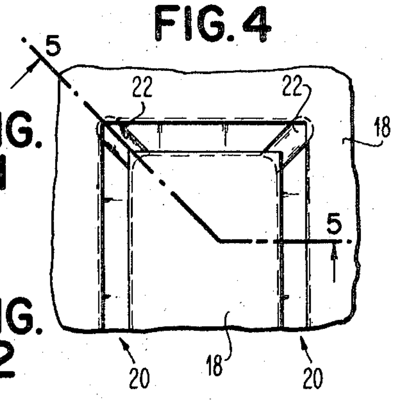
Figure 4B:
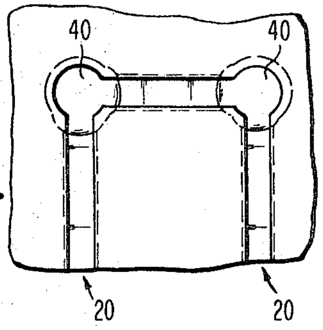
Figure 4C:
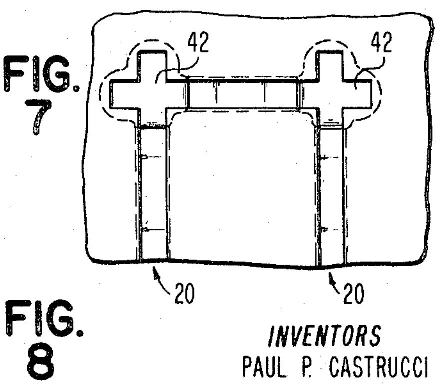

FIG. 2 illustrates the next step in this process wherein a thin masking film of a metal 18 is applied by standard techniques such as vacuum evaporation over the silicon dioxide film 14. A typical thin film mask would be composed of a thin film of chromium of about 1500 A. in thickness followed by a thin film of gold of about 1500 A. in thickness. Openings, as shown in FIG. 3, in a line pattern are provided in the masking layers of metal 18 and silicon dioxide 14 using the conventional photoresist process. The line pattern of the mask has at least one corner in it. The assembled structure of FIG. 3 is then placed in a suitable etching environment and the silicon is etched to produce the isolation channels 20 illustrated in FIGS. 4 and 5. The etching is continued until the deeper channel portions 22, which occur at the corners of the line patterns, reach the dielectric layer 16 on the opposite side of the semiconductor wafer 10. The detection of the depth guide areas reaching the layer 16 can be done visually such as by eye since the silicon dioxide layer is transparent, or by use of measuring devices. An important feature of the present invention involves the use of the phenomena which occur at the corners in the very narrow line pattern being etched. When using a line pattern of a width less than about 1.0 mil, somewhat deeper etching occurs. Where the line width is about 0.4 to 0.5 mil the deeper etching will be between about 0.02 to 0.04 mil deeper in the corners because of excessive heat generated in that area. FIG. 4A which is a plan view of FIG. 5 wherein the sectional view of FIG. 5 is taken along FIG. 4A shows the corner effect. FIGS. 4B and 4C are modifications of the FIG. 4A embodiment showing configurations which will further enhance the depths of the etching process at the corners of the line pattern. FIG. 4B uses a rounded area 40 at the corner of the line pattern and FIG. 4C uses a pair of crossed lines 42. These FIGS. 4B and 4C will produce larger areas of depth in the area of the desired depth guides.

The particular silicon etch is not critical to the present inventive process. Typical etchants which can be used are a solution of 5 parts nitric acid, 3 parts acetic acid and 3 parts hydrofluoric acid with or without a small quantity of liquid bromine or 3 parts nitric acid, 2 parts acetic acid and 1 part hydrofluoric acid.

Figure 7:
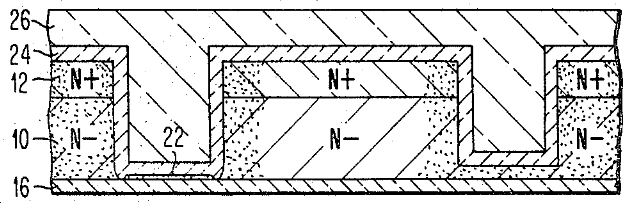

The thin film metal mask 18 is then stripped off by conventional etching. The etching solution will depend upon the particular metal mask being used. For the preferred thin film of chromium and gold the mask is stripped by use of successive etches of a solution of potassium iodide, KI, and iodine, $I_2$, and a solution of potassium ferric cyanide, $K_3Fe(CN)_6$, and sodium hydroxide, NaOH, The silicon dioxide layer 14 is also stripped from the N+ layer 12 of the wafer by etching using a solution of hydrofluoric acid buffered with ammonium fluoride, $NH_4F$. Care is taken to prevent removal of the dielectric layer 16, the stripping process for removing layers 14 and 18. A dielectric layer 24 is then formed over the exposed surface of the isolation channels 20 and the surface of layer 12. Where silicon is the substrate the layer is preferably formed by thermal oxidation. Semiconductor material is then grown over the dielectric layer 24 by conventional vapor growth techniques until a layer 26 is formed as shown in FIG. 7 which fills the channels 20. The material of the layer 26 will be typically a polycrystalline material such as, in the case of the use of a silicon tetrachloride vapor growth technique, polycrystalline silicon. Fully isolated islands 30 of semiconductor material are then produced by extending the dielectric layer 16 deeper into the semiconductor substrate 10, such as by thermally oxidizing the silicon substrate, past the depth guide portions of the isolation channel 22 until the islands are fully isolated. A quick visual inspection can detect complete or incomplete isolation due to the transparency of the silicon dioxide in the case of silicon dioxide. A typical oxidation cycle for approximately 20,000 A. units in thickness of silicon dioxide is approximately 15 minutes in dry oxygen gas followed by 300 minutes in steam at about 1200° C.

Figure 8:
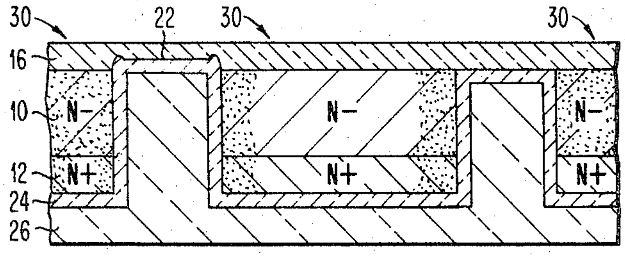

FIG. 8 shows the resulting dielectrically isolated planar structure. This structure, because of the use of the depth guide portions of the isolation channels as described, is almost perfectly planar and can now be conventionally photomasked using conventional photolithographic techniques. Monolithic semiconductor devices can then be formed in the isolated islands.

FIGS. 9 through 15 illustrate a second embodiment for fabricating planar dielectrically isolated semiconductor devices using the depth guide technique. The use of identical numbers indicates identical structures.

Figure 9:
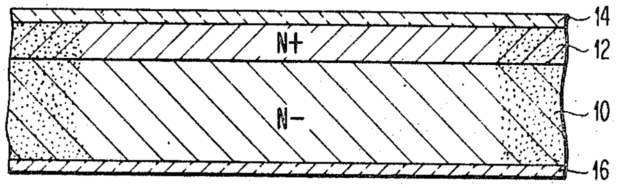
FIGS. 9–15 illustrate a second embodiment for fabricating planar dielectrically isolated semiconductor devices.
Figure 10:
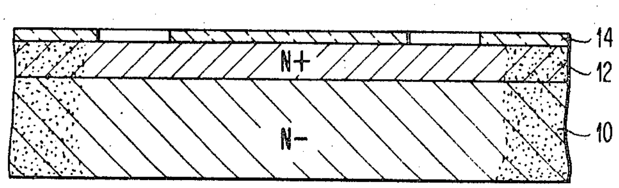
Figure 11:
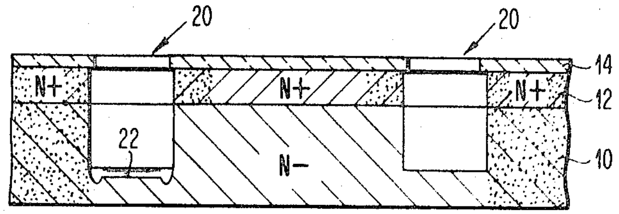
Figure 12:
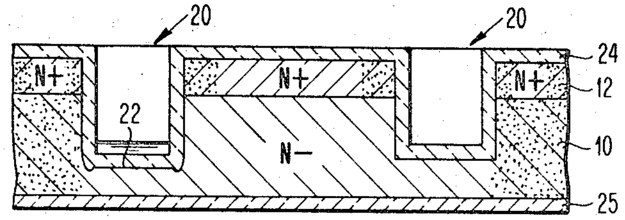
Figure 13:
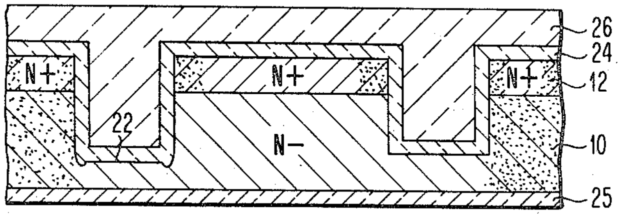

FIG. 9 illustrates the initial steps in the process wherein an N-type monocrystalline semiconductor material substrate 10 is again used. An N+ epitaxial layer 12 is grown upon the substrate 10 by conventional epitaxial growth techniques. The surface of the epitaxial layer 12 has applied to it a dielectric layer, such as by thermal oxidation particularly where the substrate is silicon to produce the silicon dioxide layers 14 and 16. Openings in a line pattern having at least one corner are then formed in the silicon dioxide layer 14 by use of conventional photoresist procedures. The dielectric openings are removed by a suitable chemical etching technique, and the photoresist material is then removed. During this etching the layer 16 is removed. The isolation channels 20 are then etched using any suitable etch for the semiconductor used as a substrate. As described before in the first embodiment the etching proceeds at the corner areas somewhat deeper, as seen at 22, than at other portions of the channel regardless of the etchant utilized. The sectional views in FIGS. 11 to 15 are all taken along a section similar to the one shown in FIG. 4A so as to illustrate the cross-section of the isolation channel 20 at both a corner area and at an area which is representative of a bulk of an isolation channel. In this embodiment the etch extends only partially through the semiconductor substrate 10. The dielectric layer 14 which was used as a mask for the etching step is then stripped by use of a suitable etching or lapping technique. A dielectric layer 24 is now formed over the exposed surfaces of the isolation channels and the N+ type semiconductor layer 12. Simultaneously the layer 25 is formed over the opposite side of the wafer. Semiconductor material such as polycrystalline silicon is now grown by conventional vapor deposition techniques over the previously formed dielectric layer 24 in the isolation channels and over the surface of the wafer to produce the layer 26.

Figure 14:
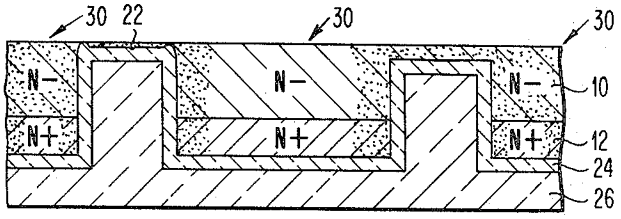
Figure 15:
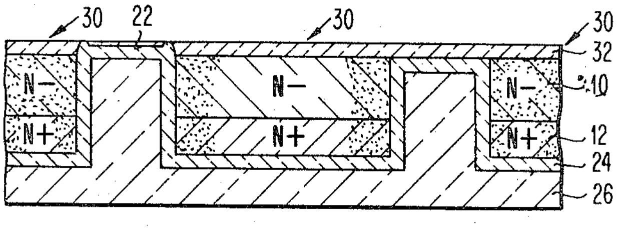

Portions of the substrate 10, together with layer 25, are removed such as by chemical etching or mechanical lapping procedures until deeper corner areas 22 of the isolation channels appear. The removal procedure will then be made to stop as shown in FIG. 14. A dielectric layer 32 is now formed on the substrate surface and into the surface of the substrate 10 until the isolated islands 30 of the semiconductor material are completely isolated from one another by the isolation channels such as shown in FIG. 15. Where the substrate is silicon, the dielectric layer is formed by the thermal oxidation described above in the first embodiment.

While the invention has been particularly shown and described with reference to the preferred embodiments thereof, it will be understood by those skilled in the art that various changes in form and details may be made therein without departing from the spirit and scope of the invention.

What is claimed is:

1. A process for fabricating planar dielectric isolated silicon semiconductor devices comprising:
- forming openings in a line pattern in a dielectric layer adherent to one surface of a silicon semiconductor substrate, said line pattern having a larger cross-sectional area at certain locations;
- etching said one surface of the said silicon semiconductor substrate in the established said line pattern to produce isolation channels in the substrate, which channels are etched somewhat deeper at the said certain locations having the larger cross-sectional areas;
- forming a dielectric layer over the exposed surfaces of said isolation channels;
- growing polycrystalline material over the previously formed said dielectric layer in said isolation channels; and
- forming a dielectric layer from the surface opposite to said one surface using said deeper etched locations in said dielectric layer within said isolation channels as depth guides to produce isolated islands of semiconductor material in said substrate.

2. The process of claim 1 wherein material is removed from the surface opposite to said one surface until the said deeper etched locations in said dielectric layer within said isolation channels are reached prior to forming said dielectric layer from said opposite surface.

3. The process of claim 1 and further comprising forming a layer of dielectric on said surface opposite to said one surface prior to said etching of said substrate and continuing said etching of said substrate until the said deeper etched locations in said isolation channels reach said layer of dielectric on said surface opposite to said one surface.

4. The process of claim 1 wherein semiconductor devices are formed in said isolated islands.

5. The process of claim 1 wherein said line pattern has at least one corner whereat said channel is etched somewhat deeper than the remaining channels.

6. The process of claim 5 wherein said corner includes a round area.

7. The process of claim 5 wherein said corner includes a pair of crossed lines.

8. A process for fabricating planar isolated silicon semiconductor devices comprising:
- forming dielectric layers on opposite sides of a silicon semiconductor substrate;
- forming openings in a line pattern having at least one corner in a dielectric layer adherent to one surface of said silicon semiconductor substrate;
- etching said one surface of said silicon semiconductor substrate in the established said line pattern to produce isolation channels in the substrate, which channels are etched somewhat deeper at said corner;
- continuing said etching until said dielectric layer on the side opposite to said one surface is reached at said deeper channel portion at said corner;
- forming a dielectric layer over the exposed surfaces of said isolation channel;
- growing silicon semiconductor material over the previously formed said dielectric layer in said isolation channels; and
- extending the said dielectric layer, on the side opposite the said one side, into said substrate until fully isolated islands of silicon semiconductor material are formed in the said substrate.

9. The process of claim 8 wherein the said semiconductor substrate is silicon and the said dielectric layers are silicon dioxide formed by oxidation of said silicon substrate.

10. The process of claim 8 wherein the said deeper etched areas are between about 0.02 and 0.04 mil deeper than the remaining portions of said channels.

11. The process of claim 8 wherein a metal mask is used in addition to said dielectric layer adherent to said one side of said silicon semiconductor substrate to protect the areas of said substrate not to be etched.

12. The process of claim 8 wherein the said semiconductor substrate is monocrystalline silicon and a PN junction is formed in at least one of said isolated islands.

13. A process for fabricating planar isolated silicon semiconductor devices comprising:
- forming openings in a line pattern having at least one corner in a dielectric layer adherent to one surface of said silicon semiconductor substrate;
- etching said one surface of said silicon semiconductor substrate in the established said line pattern to produce isolation channels in the substrate, which channels are etched somewhat deeper at said corner;
- forming a dielectric layer over the exposed surfaces of said isolation channels;
- growing polycrystalline semiconductor material over the previously formed said dielectric layer in said isolation channels;
- removing material from the side opposite to said one side of said silicon semiconductor substrate until said deeper channel portion at said corner is reached; and
- forming a dielectric layer on the side opposite to said one side into the said substrate until fully isolated islands of silicon semiconductor material are formed in the said substrate.

14. The process of claim 13 wherein the said semiconductor substrate is silicon and the said dielectric layers grown in said isolation channels and on said side opposite to said one side are silicon dioxide.

15. The process of claim 13 wherein a PN junction is formed in at least one of said isolated islands.

References Cited

UNITED STATES PATENTS

| | | | |
|---|---|---|---|
| 3,139,418 | 7/1965 | Cooper et al. | 148—187 |
| 3,372,063 | 3/1968 | Suzuki | 148—1.5 |
| 3,391,023 | 7/1968 | Frescura | 117—212 |
| 3,393,349 | 7/1968 | Huffman | 317—101 |
| 3,411,200 | 11/1968 | Formigoni | 29—580 |

(Other references on following page)

UNITED STATES PATENTS

| | | | |
|---|---|---|---|
| 3,419,956 | 1/1969 | Kren et al. | 29—578 |
| 3,421,205 | 1/1969 | Pollock | 29—580 |

FOREIGN PATENTS

| | | | |
|---|---|---|---|
| 6,411,895 | 10/1964 | Netherlands | 317—101 |

OTHER REFERENCES

Seto, D. K. and Regh, J.: "Two-Level Interwiring for Monolithic Circuits," I.B.M. Technical Disclosure Bulletin, vol. 9, No. 6, November 1966, pp. 579–580.

Maxwell, D. A. et al.: "The Minimization of Parasitics in Integral Circuits by Dielectric Isolation," IEEE Transactions on Electron Devices, vol. ED–12, No. 1, January 1965, pp. 20–25.

Schnable, G. L. et al.: "Chemical Technique for Preparing Oxide-Isolated Silicon Wafers for Microcircuits," Electrochemical Tech., vol. 4, No. 1–2, Jan.–Feb. 1966, pp. 57–62.

L. DEWAYNE RUTLEDGE, Primary Examiner

W. G. SABA, Assistant Examiner

U.S. Cl. X.R.

29—578, 580; 117—200, 212; 148—1.5, 175; 156—17; 317—101, 234, 235